(12) United States Patent
Borror et al.

(10) Patent No.: US 9,772,126 B2
(45) Date of Patent: Sep. 26, 2017

(54) COOLING SYSTEM FOR HIGH DENSITY HEAT LOAD

(71) Applicant: LIEBERT CORPORATION, Columbus, OH (US)

(72) Inventors: Steven A. Borror, Columbus, OH (US); Franklin E. DiPaolo, Columbus, OH (US); Thomas E. Harvey, Columbus, OH (US); Steven M. Madara, Dublin, OH (US); Reasey J. Mam, Westerville, OH (US); Stephen C. Sillato, Westerville, OH (US)

(73) Assignee: Liebert Corporation, Columbus, OH (US)

( * ) Notice: Subject to any disclaimer, the term of this patent is extended or adjusted under 35 U.S.C. 154(b) by 0 days.

(21) Appl. No.: 15/004,495

(22) Filed: Jan. 22, 2016

(65) Prior Publication Data

US 2016/0138840 A1 May 19, 2016

Related U.S. Application Data

(63) Continuation of application No. 13/607,934, filed on Sep. 10, 2012, now Pat. No. 9,243,823, which is a (Continued)

(51) Int. Cl.
*F25B 25/00* (2006.01)
*F25B 23/00* (2006.01)
(Continued)

(52) U.S. Cl.
CPC .......... *F25B 23/006* (2013.01); *F25B 25/005* (2013.01); *F25D 21/04* (2013.01); *F25B 7/00* (2013.01)

(58) Field of Classification Search
CPC .................... F25B 7/00; F25B 25/005
See application file for complete search history.

(56) References Cited

U.S. PATENT DOCUMENTS 2,244,312 A   6/1941   Newton
3,005,321 A   10/1961  Devery
(Continued)

FOREIGN PATENT DOCUMENTS

DE   19804901 A   8/1999
DE   29908370     9/1999
(Continued)

OTHER PUBLICATIONS

Baer, D.B. "Emerging Cooling Requirements & Systems in Telecommunications Spaces." Telecommunications Energy Conference 2001, Oct. 14-18, 2001, p. 95-100.
(Continued)

*Primary Examiner* — Jonathan Bradford
(74) *Attorney, Agent, or Firm* — Locke Lord LLP

(57) ABSTRACT

A cooling system for transferring heat from a heat load to an environment has a volatile working fluid. The cooling system includes first and second cooling cycles that are thermally connected to the first cooling cycle. The first cooling cycle is not a vapor compression cycle and includes a pump, an air-to-fluid heat exchanger, and a fluid-to-fluid heat exchanger. The second cooling cycle can include a chilled water system for transferring heat from the fluid-to-fluid heat exchanger to the environment. Alternatively, the second cooling cycle can include a vapor compression system for transferring heat from the fluid-to-fluid heat exchanger to the environment.

27 Claims, 3 Drawing Sheets

Related U.S. Application Data continuation of application No. 10/904,889, filed on Dec. 2, 2004, now Pat. No. 8,261,565.

(60) Provisional application No. 60/527,527, filed on Dec. 5, 2003.

(51) Int. Cl.
  *F25D 21/04* (2006.01)
  *F25B 7/00* (2006.01)

(56) References Cited

U.S. PATENT DOCUMENTS

| | | | |
|---|---|---|---|
| 3,253,646 A | 5/1966 | Koltuniak et al. | |
| 3,317,798 A | 5/1967 | Chu et al. | |
| 3,334,684 A | 8/1967 | Roush et al. | |
| 3,749,981 A | 7/1973 | Koltuniak et al. | |
| 3,754,596 A | 8/1973 | Ward, Jr. | |
| 3,774,677 A | 11/1973 | Antoneti et al. | |
| 3,817,321 A | 6/1974 | Von Cube et al. | |
| 4,019,679 A | 4/1977 | Vogt et al. | |
| 4,238,933 A | 12/1980 | Coombs | |
| 4,240,499 A | 12/1980 | Kals | |
| 4,308,042 A | 12/1981 | Ecker | |
| 4,314,601 A | 2/1982 | Giuffre et al. | |
| 4,315,300 A | 2/1982 | Parmerlee et al. | |
| 4,344,296 A | 8/1982 | Staples et al. | |
| 4,495,780 A | 1/1985 | Kaneko et al. | |
| 4,512,161 A | 4/1985 | Logan et al. | |
| 4,514,746 A | 4/1985 | Lundqvist | |
| 4,756,164 A | 7/1988 | James et al. | |
| 4,911,231 A | 3/1990 | Horne et al. | |
| 5,035,628 A | 7/1991 | Casciotti et al. | |
| 5,054,542 A | 10/1991 | Young et al. | |
| 5,123,478 A | 6/1992 | Hosaka | |
| 5,150,277 A | 9/1992 | Bainbridge | |
| 5,161,087 A | 11/1992 | Frankeny et al. | |
| 5,220,809 A | 6/1993 | Voss | |
| 5,261,251 A * | 11/1993 | Galiyano | F24F 5/0046 |
| | | | 62/176.6 |
| 5,273,438 A | 12/1993 | Bradley et al. | |
| 5,329,425 A | 7/1994 | Leyssens et al. | |
| 5,333,677 A | 8/1994 | Molivadas | |
| 5,335,508 A | 8/1994 | Tippmann | |
| 5,376,008 A | 12/1994 | Rodriguez | |
| 5,395,251 A | 3/1995 | Rodriguez et al. | |
| 5,400,615 A | 3/1995 | Pearson | |
| 5,402,313 A | 3/1995 | Casperson et al. | |
| 5,406,807 A | 4/1995 | Ashiwake et al. | |
| 5,410,448 A | 4/1995 | Barker et al. | |
| 5,414,591 A | 5/1995 | Kimura | |
| 5,467,607 A | 11/1995 | Harvey | |
| 5,471,850 A | 12/1995 | Cowans | |
| 5,522,452 A | 6/1996 | Mizuno et al. | |
| 5,570,740 A | 11/1996 | Flores et al. | |
| 5,603,375 A | 2/1997 | Salt | |
| 5,657,641 A | 8/1997 | Cunningham et al. | |
| 5,673,029 A | 9/1997 | Behl | |
| 5,709,100 A | 1/1998 | Baer et al. | |
| 5,713,413 A | 2/1998 | Osakabe et al. | |
| 5,718,628 A | 2/1998 | Nakazato et al. | |
| 5,737,923 A | 4/1998 | Gilley et al. | |
| 5,740,018 A | 4/1998 | Rumbut | |
| 5,847,927 A | 12/1998 | Minning et al. | |
| 5,984,647 A | 11/1999 | Miyamoto et al. | |
| 5,987,902 A | 11/1999 | Scaringe et al. | |
| 6,024,165 A | 2/2000 | Melane et al. | |
| 6,026,891 A | 2/2000 | Fujiyoshi et al. | |
| 6,046,908 A | 4/2000 | Feng | |
| 6,105,387 A | 8/2000 | Hong | |
| 6,115,242 A | 9/2000 | Lambrecht | |
| 6,148,626 A | 11/2000 | Iwamoto | |
| 6,158,502 A | 12/2000 | Thomas | |
| 6,167,948 B1 | 1/2001 | Thomas | |
| 6,185,098 B1 | 2/2001 | Benavides | |
| 6,205,796 B1 | 3/2001 | Chu et al. | |
| 6,205,803 B1 | 3/2001 | Scaringe | |
| 6,208,510 B1 | 3/2001 | Trudeau et al. | |
| 6,258,293 B1 | 7/2001 | Iizuka et al. | |
| 6,298,677 B1 | 10/2001 | Bujak, Jr. | |
| 6,299,526 B1 | 10/2001 | Cowan et al. | |
| 6,305,180 B1 | 10/2001 | Miller et al. | |
| 6,305,463 B1 | 10/2001 | Salmonson | |
| 6,310,773 B1 | 10/2001 | Yusuf et al. | |
| 6,416,330 B1 | 7/2002 | Yatskov | |
| 6,435,266 B1 | 8/2002 | Wu | |
| 6,460,355 B1 | 10/2002 | Trieskey | |
| 6,508,301 B2 | 1/2003 | Marsala | |
| 6,515,862 B1 | 2/2003 | Wong et al. | |
| 6,519,955 B2 | 2/2003 | Marsala | |
| 6,550,530 B1 | 4/2003 | Bilski | |
| 6,557,624 B1 | 5/2003 | Stahl et al. | |
| 6,564,858 B1 | 5/2003 | Stahl | |
| 6,628,520 B2 | 9/2003 | Patel et al. | |
| 6,631,624 B1 * | 10/2003 | Kirol | F25B 15/04 |
| | | | 62/238.7 |
| 6,644,384 B2 | 11/2003 | Stahl | |
| 6,679,081 B2 | 1/2004 | Marsala | |
| 6,742,345 B2 | 6/2004 | Carr | |
| 6,772,604 B2 | 8/2004 | Bash et al. | |
| 6,827,135 B1 | 12/2004 | Kramer et al. | |
| 6,881,141 B2 | 4/2005 | Knight | |
| 6,976,529 B2 | 12/2005 | Kester | |
| 6,992,889 B1 | 1/2006 | Kashiwagi et al. | |
| 6,999,316 B2 | 2/2006 | Hamman | |
| 7,051,802 B2 | 5/2006 | Baer | |
| 7,236,359 B2 | 6/2007 | Strobel | |
| 7,469,555 B2 | 12/2008 | Taras et al. | |
| 2001/0042616 A1 | 11/2001 | Baer | |
| 2001/0052412 A1 | 12/2001 | Tikka | |
| 2002/0039280 A1 | 4/2002 | O'Connor et al. | |
| 2002/0066280 A1 | 6/2002 | Ohkawara | |
| 2002/0117291 A1 | 8/2002 | Cheon | |
| 2002/0124585 A1 | 9/2002 | Bash et al. | |
| 2002/0184908 A1 | 12/2002 | Brotz et al. | |
| 2003/0010477 A1 | 1/2003 | Khrustalev | |
| 2003/0051859 A1 | 3/2003 | Chesser | |
| 2003/0061824 A1 * | 4/2003 | Marsala | F25B 23/006 |
| | | | 62/119 |
| 2003/0126872 A1 | 7/2003 | Harano et al. | |
| 2003/0147214 A1 * | 8/2003 | Patel | G06F 1/20 |
| | | | 361/699 |
| 2003/0147216 A1 | 8/2003 | Patel et al. | |
| 2003/0182949 A1 | 10/2003 | Carr | |
| 2004/0025516 A1 | 2/2004 | Van Winkle | |
| 2004/0100770 A1 | 5/2004 | Chu et al. | |
| 2004/0184233 A1 | 9/2004 | Yamada | |
| 2005/0120737 A1 | 6/2005 | Borror et al. | |
| 2005/0168945 A1 | 8/2005 | Coglitore | |
| 2006/0101837 A1 | 5/2006 | Manole | |
| 2006/0102322 A1 | 5/2006 | Madara et al. | |

FOREIGN PATENT DOCUMENTS

| | | |
|---|---|---|
| EP | 0281762 | 9/1988 |
| EP | 1357778 | 10/2003 |
| EP | 1143778 | 12/2006 |
| GB | 2113012 | 7/1983 |
| GB | 2113012 A | 7/1983 |
| JP | 2713472 | 2/1998 |
| JP | 2001091123 | 4/2001 |
| JP | 2002233218 | 8/2002 |
| JP | 2002303476 | 10/2002 |
| JP | 2003065618 | 3/2003 |
| JP | 2004028484 | 1/2004 |
| JP | 3680043 | 8/2005 |

OTHER PUBLICATIONS

Vogel, Marlin et al. "Low Profile Heat Sink Cooling Technologies for Next Generation CPU Thermal Designs." Electronic Cooling Online, Feb. 17, 2005, 11 pages.

(56) References Cited

OTHER PUBLICATIONS

Webb, Warren. "Take the heat: Cool that hot embedded design." EDN, May 13, 2004, 5 pages.
JAMSTEC/Earth Simulator Center, "Processor Node (PN) Cabinet." one page. http://www.es.jamstec.go.jp/esc/eng/Hardware/pnc.html [accessed Mar. 5, 2004].
Hannemann, Robert et al. "Pumped Liquid Multiphase Cooling." ASME, 2004, IMECE 2004, Paper IMECE2004-60699, Anaheim, California, 5 pages.
"Thermal Form & Function—Rack Cooling System (RCS)." Thermal Form & Function LLC, 2005, Manchester, MA, one page. http://www.thermalformandfunction.com/racksystem.html [accessed May 11, 2006].
Pitasi, M. "Thermal Management System Using Pumped Liquid R-134a with Two Phase Heat Transfer." Thermal Form & Function LLC, Mar. 2002, Manchester, MA, pp. 1-9. http:www.coolingzone.com/Guest/News/NL_MAR_2002/TFF/Tff.html.
Marsala, Joe. "Pumped Liquid/Two Phase Cooling for High Performance Systems."Thermal Form & Function LLC, May 13, 2003, Scottsdale, Arizona, 19 pages.
"Managing Extreme Heat Cooling Strategies for High-Density Computer Systems." Liebert Corporation, Dec. 7, 2003, Columbus, Ohio, 16 pages.
Klingeberg, G. "Kombination Spart Strom bei der Schaltschrankklimatisierung." Elektrotechnik, Vogel Verley K. G., Wurzburg DE, Nov. 5, 1998.
Miot, F. International Search Report for International Patent Application No. PCT/US2005/040745, dated Mar. 30, 2006, European Patent Office.
Miot, F. Written Opinion for International Patent Application No. PCT/US2005/040745, dated Mar. 30, 2006, European Patent Office.
Miot, F. International Search Report for International Patent Application No. PCT/US2006/028088, dated Jun. 18, 2007, European Patent Office.
Miot, F., Written Opinion for International Patent Application No. PCT/US2006/028088, dated Jun. 18, 2007, European Patent Office.
Emerson Network Power—Liebert Foundation; "Protection for Today's Needs . . . and Tomorrow's Opportunities; Encloser Systems." 2003, p. 1-16.
Emerson Network Power—Liebert Foundation; "Wall Mount Equipment Enclosures Designed for Tight Spaces." 2003. p. 1-2.
Szilagyi, B., Extended European Search Report for European Application No. EP 10 18 3253.3, Munich, dated Jan. 26, 2011.
American Society of Heating, Refrigerating and Air-Conditioning Engineers, Inc., "Heating, Ventilating, and Air-Conditioning Systems and Equipment", SI Edition, 1996 ASHRAE Handbook, p. 12-11-12.12, Atlanta, Georgia.
S.F. Pearson, "Development of Improved Secondary Refrigerants", The Proceedings of the Institute of Refrigeration, Mar. 4, 1993, The Institute of Refrigeration, vol. 89, 1992-1993, London.
Szilagyi, B., European Communication for European Patent Application No. 04 812 840.9, dated Feb. 19, 2009.
Robert A. Swanson, letter to Albert B. Deaver, Jr., Jun. 29, 2010 (unpublished).
Szilagyi, B., Extended Search Report for European Application No. EP 04 812 840.9, Munich, dated Jul. 6, 2007.
Szilagyi, B., European Communication for European Patent Application No. 04 812 840.9, dated Mar. 28, 2008.
Szilagyi, B., International Search Report for International Patent Application No. PCT/US2004/040407, dated Jun. 30, 2005, European Patent Office.
Szilagyi, B., Written Opinion for International Patent Application No. PCT/US2004/040407, dated Jun. 30, 2005, European Patent Office.

\* cited by examiner

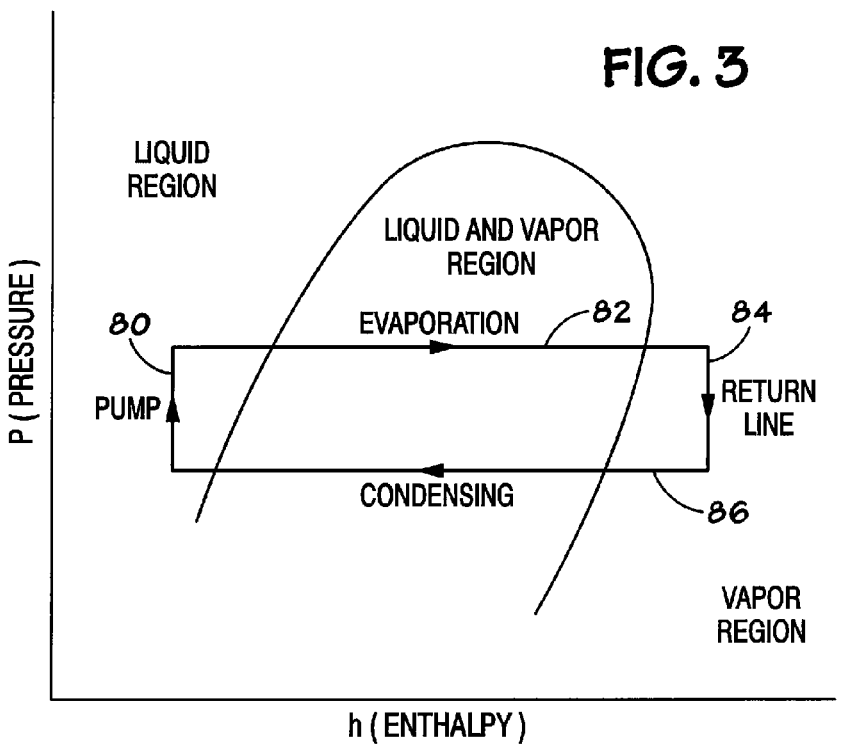
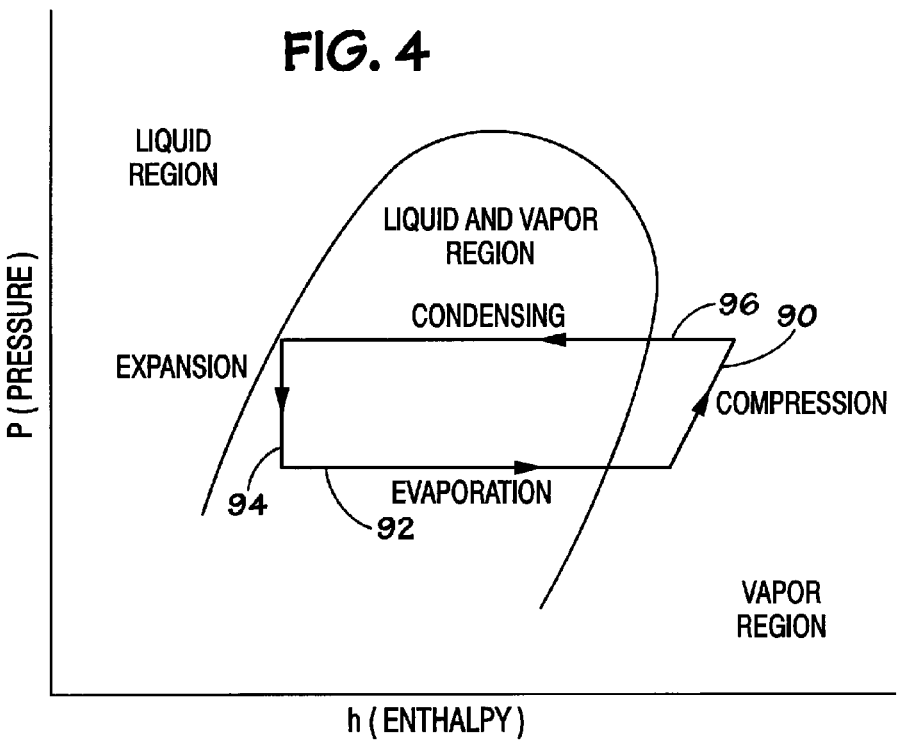

COOLING SYSTEM FOR HIGH DENSITY HEAT LOAD

CROSS-REFERENCE TO RELATED APPLICATION

This application is a continuation of U.S. application Ser. No. 13/607,934, filed Sep. 10, 2012, which is a continuation of U.S. application Ser. No. 10/904,889, filed Dec. 2, 2004, which claims the benefit of U.S. Provisional Patent Application Ser. No. 60/527,527, filed Dec. 5, 2003, each of which are incorporated by reference.

BACKGROUND

The present disclosure generally relates to cooling systems, and more particularly, to a cooling system for a high density heat load.

Electronic equipment in a critical space, such as a computer room or telecommunications room, requires precise, reliable control of room temperature, humidity, and airflow. Excessive heat or humidity can damage or impair the operation of computer systems and other components. For this reason, precision cooling systems are operated to provide cooling in these situations. However, problems may occur when cooling such high density heat loads using a direct expansion (DX) cooling system. Existing DX systems for high-density loads monitor air temperatures and other variables to control the cooling capacity of the system in response to load changes. Thus, existing DX systems require rather sophisticated controls, temperature sensors, and other control components. Therefore, a need exists for a cooling system that is responsive to varying density heat loads and that requires less control of valves and other system components. Moreover, conventional computer room air conditioning systems require excessive floor space for managing high-density heat loads. The present disclosure is directed to overcoming, or at least reducing the effects of, one or more of the problems set forth above.

SUMMARY

A cooling system is disclosed for transferring heat from a heat load to an environment. The cooling system has a working fluid, which is a volatile working fluid in exemplary embodiments. The cooling system includes first and second cooling cycles that are thermally connected to one another. The first cooling cycle includes a pump, a first heat exchanger, and a second heat exchanger.

The first heat exchanger is in fluid communication with the pump through piping and is in thermal communication with the heat load, which may be a computer room, electronics enclosure, or other space. The first heat exchanger can be an air-to-fluid heat exchanger, for example. In addition, a flow regulator can be positioned between the pump and the first heat exchanger.

The second heat exchanger includes first and second fluid paths in thermal communication with one another. The second heat exchanger can be a fluid-to-fluid heat exchanger, for example. The first fluid path for the working fluid of the cooling system connects the first heat exchanger to the pump. The second fluid path forms part of the second cooling cycle.

In one embodiment of the disclosed cooling system, the second cooling cycle includes a chilled water system in thermal communication with the environment. In another embodiment of the disclosed cooling system, the second cooling cycle includes a refrigeration system in thermal communication with the environment. The refrigeration system can include a compressor, a condenser, and an expansion device. The compressor is in fluid communication with one end of the second fluid path of the second heat exchanger. The condenser, which can be an air-to-fluid heat exchanger, is in fluid communication with the environment. The condenser has an inlet connected to the compressor and has an outlet connected to another end of the second fluid path through the second heat exchanger. The expansion device is positioned between the outlet of the condenser and the other end of the second fluid path.

The foregoing summary is not intended to summarize each potential embodiment or every aspect of the present disclosure.

BRIEF DESCRIPTION OF THE DRAWINGS

The foregoing summary, a preferred embodiment, and other aspects of the subject matter of the present disclosure will be best understood with reference to the following detailed description of specific embodiments when read in conjunction with the accompanying drawings, in which:

FIG. 3 illustrates a cycle diagram of the disclosed cooling system.

FIG. 4 illustrates a cycle diagram of a typical vapor compression refrigeration system.

Figure 1:
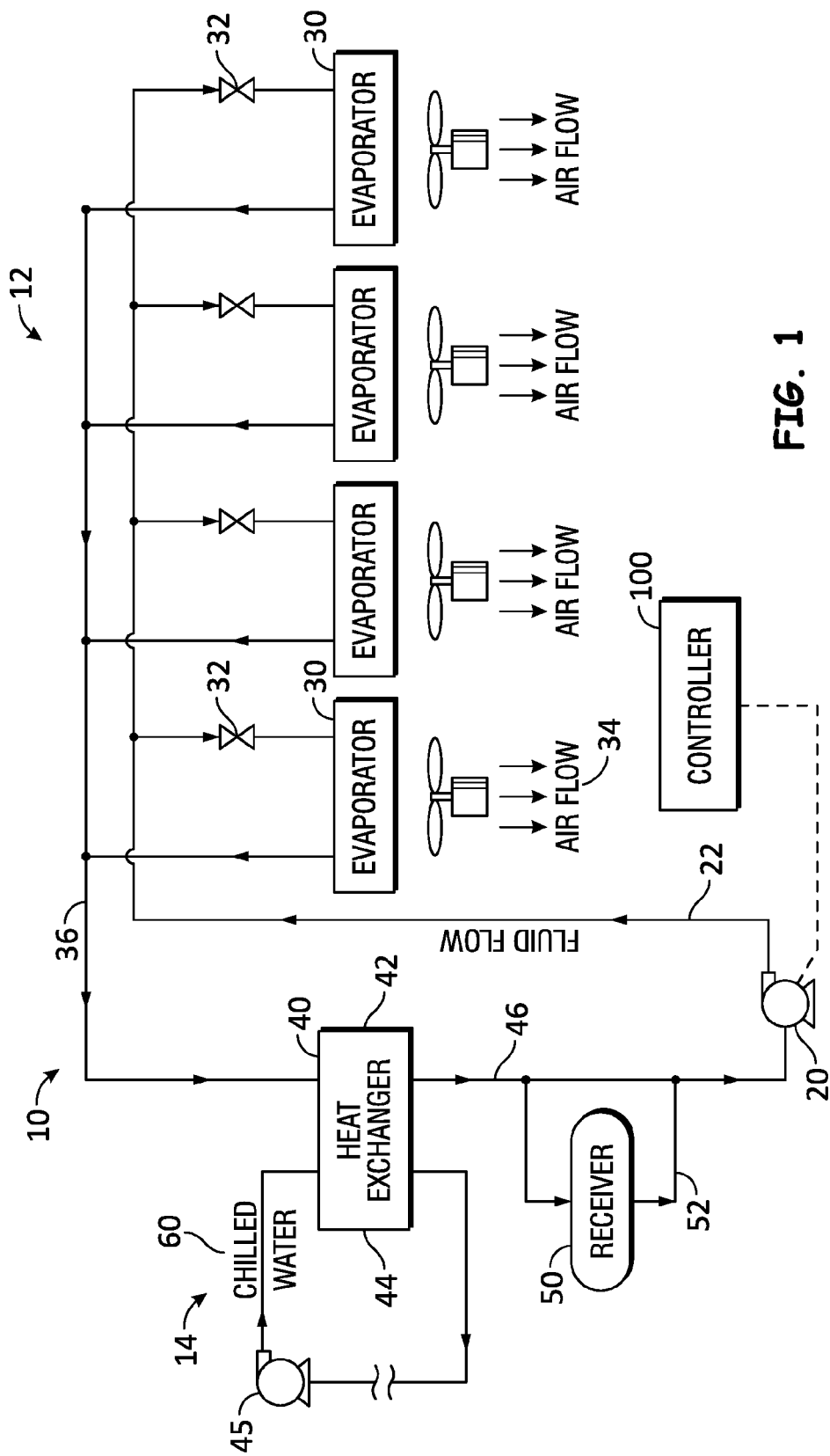
FIG. 1 schematically illustrates one embodiment of a cooling system according to certain teachings of the present disclosure.

While the disclosed cooling system is susceptible to various modifications and alternative forms, specific embodiments thereof have been shown by way of example in the drawings and are described herein in detail. The figures and written description are not intended to limit the scope of the inventive concepts in any manner. Rather, the figures and written description are provided to illustrate the inventive concepts to a person of ordinary skill in the art by reference to particular embodiments.

DETAILED DESCRIPTION

Figure 2:
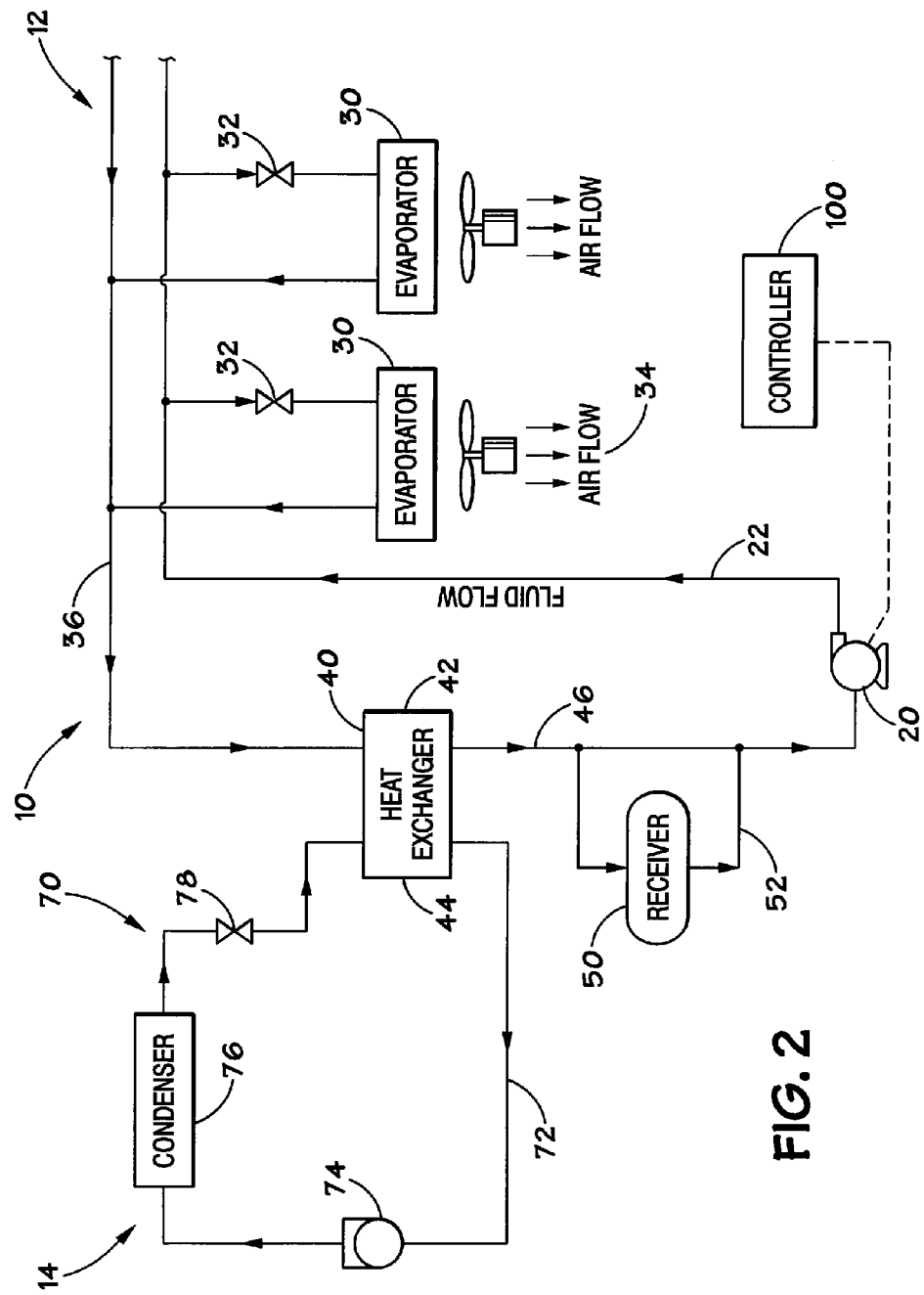
FIG. 2 schematically illustrates another embodiment of a cooling system according to certain teachings of the present disclosure.

Referring to FIGS. 1 and 2, the disclosed cooling system 10 includes a first cooling cycle 12 in thermal communication with a second cycle 14. The disclosed cooling system 10 also includes a control system 100. Both the first and second cycles 12 and 14 include independent working fluids. The working fluid in the first cycle is any volatile fluid suitable for use as a conventional refrigerant, including but not limited to chlorofluorocarbons (CFCs), hydrofluorocarbons (HFCs), or hydrochloro-fluorocarbons (HCFCs). Use of a volatile working fluid eliminates the need for using water located above sensitive equipment, as is sometimes done in conventional systems for cooling computer room. The first cycle 12 includes a pump 20, one or more first heat exchangers (evaporators) 30, a second heat exchanger 40, and piping to interconnect the various components of the first cycle 12. The first cycle 12 is not a vapor compression refrigeration system. Instead, the first cycle 12 uses the pump 20 instead of a compressor to circulate a volatile working fluid for removing heat from a heat load. The pump 20 is preferably capable of pumping the volatile working fluid throughout the first cooling cycle 12 and is preferably controlled by the control system 100.

The first heat exchanger 30 is an air-to-fluid heat exchanger that removes heat from the heat load (not shown) to the first working fluid as the first working fluid passes through the first fluid path in first heat exchanger 30. For example, the air-to-fluid heat exchanger 30 can include a plurality of tubes for the working fluid arranged to allow warm air to pass therebetween. It will be appreciated that a number of air-to-fluid heat exchangers known in the art can be used with the disclosed cooling system 10. A flow regulator 32 can be connected between the piping 22 and the inlet of the evaporator 30 to regulate the flow of working fluid into the evaporator 30. The flow regulator 32 can be a solenoid valve or other type of device for regulating flow in the cooling system 10. The flow regulator 32 preferably maintains a constant output flow independent of the inlet pressure over the operating pressure range of the system. In the embodiment of FIGS. 1 and 2, the first cycle 12 includes a plurality of evaporators 30 and flow regulators 32 connected to the piping 22. However, the disclosed system can have one or more than one evaporator 30 and flow regulators 32 connected to the piping 22.

The second heat exchanger 40 is a fluid-to-fluid heat exchanger that transfers the heat from the first working fluid to the second cycle 14. It will be appreciated that a number of fluid-to-fluid heat exchangers known in the art can be used with the disclosed cooling system 10. For example, the fluid-to-fluid heat exchanger 40 can include a plurality of tubes for one fluid positioned in a chamber or shell containing the second fluid. A coaxial ("tube-in-tube") exchanger would also be suitable. In certain embodiments, it is preferred to use a plate heat exchanger. The first cycle 12 can also include a receiver 50 connected to the outlet piping 46 of the second heat exchanger 40 by a bypass line 52. The receiver 50 may store and accumulate the working fluid in the first cycle 12 to allow for changes in the temperature and heat load.

In one embodiment, the air-to-fluid heat exchanger 30 can be used to cool a room holding computer equipment. For example, a fan 34 can draw air from the room (heat load) through the heat exchanger 30 where the first working fluid absorbs heat from the air. In another embodiment, the air-to-fluid heat exchanger 30 can be used to directly remove heat from electronic equipment (heat load) that generates the heat by mounting the heat exchanger 30 on or close to the equipment. For example, electronic equipment is typically contained in an enclosure (not shown). The heat exchanger 30 can mount to the enclosure, and fans 34 can draw air from the enclosure through the heat exchanger 30. Alternatively, the first exchanger 30 may be in direct thermal contact with the heat source (e.g. a cold plate). It will be appreciated by those skilled in the art that the heat transfer rates, sizes, and other design variables of the components of the disclosed cooling system 10 depend on the size of the disclosed cooling system 10, the magnitude of the heat load to be managed, and on other details of the particular implementation.

In the embodiment of the disclosed cooling system 10 depicted in FIG. 1, the second cycle 14 includes a chilled water cycle 60 connected to the fluid-to-fluid heat exchanger 40 of the first cycle 12. In particular, the second heat exchanger 40 has first and second portions or fluid paths 42 and 44 in thermal communication with one another. The first path 42 for the volatile working fluid is connected between the first heat exchanger 30 and the pump. The second fluid path 44 is connected to the chilled water cycle 60, which can include a pump 45 for cycling the working fluid. The chilled water cycle 60 may be similar to those known in the art. The chilled water system 60 includes a second working fluid that absorbs heat from the first working fluid passing through the fluid-to-fluid heat exchanger 40. The second working fluid is then chilled by techniques known in the art for a conventional chilled water cycle. In general, the second working fluid can be either volatile or non-volatile. For example, in the embodiment of FIG. 1, the second working fluid can be water, glycol or mixtures thereof. Therefore, the embodiment of the first cycle 12 in FIG. 1 can be constructed as an independent unit that houses the pump 20, air-to-fluid heat exchanger 30, and fluid-to-fluid heat exchanger 40 and can be connected to an existing chilled water service that is available in the building housing the equipment to be cooled, for example.

In the embodiment of the disclosed cooling system 10 in FIG. 2, the first cycle 12 is substantially the same as that described above. However, the second cycle 14 includes a vapor compression refrigeration system 70 connected to the second portion or flow path 44 of heat exchanger 40 of the first cycle 12. Instead of using chilled water to remove the heat from the first cycle 12 as in the embodiment of FIG. 1, the refrigeration system 70 in FIG. 2 is directly connected to or is the "other half" of the fluid-to-fluid heat exchanger 40. The vapor compression refrigeration system 70 can be substantially similar to those known in the art. An exemplary vapor compression refrigeration system 70 includes a compressor 74, a condenser 76, and an expansion device 78. Piping 72 connects these components to one another and to the second flow path 44 of the heat exchanger 40.

The vapor compression refrigeration system 70 removes heat from the first working fluid passing through the second heat exchanger 40 by absorbing heat from the exchanger 40 with a second working fluid and expelling that heat to the environment (not shown). The second working fluid can be either volatile or non-volatile. For example, in the embodiment of FIG. 2, the second working fluid can be any conventional chemical refrigerant, including but not limited to chlorofluorocarbons (CFCs), hydrofluorocarbons (HFCs), or hydrochloro-fluorocarbons (HCFCs). The expansion device 78 can be a valve, orifice or other apparatus known to those skilled in the art to produce a pressure drop in the working fluid passing therethrough. The compressor 74 can be any type of compressor known in the art to be suitable for refrigerant service such as reciprocating compressors, scroll compressors, or the like. In the embodiment depicted in FIG. 2, the cooling system 10 is self-contained. For example, the vapor compression refrigeration system 70 can be part of a single unit that also houses pump 20 and fluid-to-fluid heat exchanger 30.

During operation of the disclosed system, pump 20 moves the working fluid via piping 22 to the air-to-fluid heat exchanger 30. Pumping increases the pressure of the working fluid, while its enthalpy remains substantially the same. (See leg 80 of the cycle diagram in FIG. 3). The pumped working fluid can then enter the air-to-fluid heat exchanger or evaporator 30 of the first cycle 12. A fan 34 can draw air from the heat load through the heat exchanger 30. As the warm air from the heat load (not shown) enters the air-to-fluid heat exchanger 30, the volatile working fluid absorbs the heat. As the fluid warms through the heat exchanger, some of the volatile working fluid will evaporate. (See leg 82 of the cycle diagram in FIG. 3). In a fully loaded system 10, the fluid leaving the first heat exchanger 30 will be a saturated vapor. The vapor flows from the heat exchanger 30 through the piping 36 to the fluid-to-fluid heat exchanger 40. In the piping or return line 36, the working fluid is in the vapor state, and the pressure of the fluid drops while its enthalpy remains substantially constant. (See leg 84 of the cycle diagram in FIG. 3). At the fluid-to-fluid heat exchanger 40, the vapor in the first fluid path 42 is condensed by transferring heat to the second, colder fluid of the second cycle 12 in the second fluid path 44. (See leg 86 of the cycle diagram in FIG. 3). The condensed working fluid leaves the heat exchanger 40 via piping 44 and enters the pump 20, where the first cycle 12 can be repeated.

The second cooling cycle 14 operates in conjunction with first cycle 12 to remove heat from the first cycle 12 by absorbing the heat from the first working fluid into the second working fluid and rejecting the heat to the environment (not shown). As noted above, the second cycle 14 can include a chilled water system 60 as shown in FIG. 1 or a vapor compression refrigeration system 70 as shown in FIG. 2. During operation of chilled water system 60 in FIG. 1, for example, a second working fluid can flow through the second fluid path 44 of heat exchanger 40 and can be cooled in a water tower (not shown). During operation of refrigeration system 70 in FIG. 2, for example, the second working fluid passes through the second portion 44 of fluid-to-fluid heat exchanger 40 and absorbs heat from the volatile fluid in the first cycle 12. The working fluid evaporates in the process. (See leg 92 of the typical vapor-compression refrigeration cycle depicted in FIG. 4). The vapor travels to the compressor 74 where the working fluid is compressed. (See leg 90 of the refrigeration cycle in FIG. 4). The compressor 74 can be a reciprocating, scroll or other type of compressor known in the art. After compression, the working fluid travels through a discharge line to the condenser 76, where heat from the working fluid is dissipated to an external heat sink, e.g., the outdoor environment. (See leg 96 of the refrigeration cycle in FIG. 4). Upon leaving condenser 76, refrigerant flows through a liquid line to expansion device 75. As the refrigerant passes through the expansion device 75, the second working fluid experiences a pressure drop. (See leg 94 of the refrigeration cycle in FIG. 4.) Upon leaving expansion device 75, the working fluid flows through the second fluid path of fluid-to-fluid heat exchanger 40, which acts as an evaporator for the refrigeration cycle 70.

Conventional cooling systems for computer rooms or the like take up valuable floor space. The present cooling system 10, however, can cool high-density heat loads without consuming valuable floor space. Furthermore, in comparison to conventional types of cooling solutions for high-density loads, such as computing rooms, cooling system 10 conserves energy, because pumping a volatile fluid requires less energy than pumping a non-volatile fluid such as water. In addition, pumping the volatile fluid reduces the size of the pump that is required as well as the overall size and cost of the piping that interconnects the system components.

The disclosed system 10 advantageously uses the phase change of a volatile fluid to increase the cooling capacity per square foot of a space or room. In addition, the disclosed system 10 also eliminates the need for water in cooling equipment mounted above computing equipment, which presents certain risks of damage to the computing equipment in the event of a leak. Moreover, since the system is designed to remove sensible heat only, the need for condensate removal is eliminated. As is known in the art, cooling air to a low temperature increases the relative humidity, meaning condensation is likely to occur. If the evaporator is mounted on an electronics enclosure, for example, condensation may occur within the enclosure, which poses significant risk to the electronic equipment. In the present system, the temperature in the environment surrounding the equipment is maintained above the dew point to ensure that condensation does not occur. Because the disclosed cooling system does not perform latent cooling, all of the cooling capacity of the system will be used to cool the computing equipment.

The disclosed cooling system 10 can handle varying heat loads without the complex control required on conventional direct expansion systems. The system is self-regulating in that the pump 20 provides a constant flow of volatile fluid to the system. The flow regulators 32 operate so as to limit the maximum flow to each heat exchanger 30. This action balances the flow to each heat exchanger 30 so that each one gets approximately the same fluid flow. If a heat exchanger is under "high" load, then the volatile fluid will tend to flash off at a higher rate than one under a lower load. Without the flow regulator 32, more of the flow would tend to go to the "lower" load heat exchanger because it is the colder spot and lower fluid pressure drop. This action would tend to "starve" the heat exchanger under high load and it would not cool the load properly.

The key system control parameter that is used to maintain all sensible cooling is the dewpoint in the space to be controlled. The disclosed cooling system 10 controls the either the chilled water or the vapor compression system so that the fluid going to the above mentioned heat exchangers 30 is always above the dewpoint in the space to be controlled. Staying above the dewpoint insures that no latent cooling can occur.

The foregoing description of preferred and other embodiments is not intended to limit or restrict the scope or applicability of the inventive concepts conceived by the Applicants. In exchange for disclosing the inventive concepts contained herein, the Applicants desire all patent rights afforded by the appended claims. Therefore, it is intended that the appended claims include all modifications and alterations to the full extent that they come within the scope of the following claims or the equivalents thereof.

What is claimed is:

1. A cooling system for transferring heat from a heat load, the cooling system comprising:
   a two-phase working fluid;
   a pump configured to increase the pressure of the working fluid without substantially increasing the enthalpy of the working fluid;
   an air-to-fluid heat exchanger in fluid communication with the pump and in thermal communication with the heat load;
   a fluid-to-fluid heat exchanger having a first fluid path in fluid communication with the air-to-fluid heat exchanger and the pump, and a second fluid path, the first and second fluid paths being in thermal communication with one another;
   a second heat transfer system in fluid communication with the second fluid path and comprising:
      a second portion of the fluid-to-fluid heat exchanger;
      a single phase working fluid; and
      a pump;
   wherein the air-to-fluid heat exchanger is configured so that heat from air passing through the air-to-fluid heat exchanger causes at least a portion of the two-phase working fluid to change phase from a liquid to a gas within the air-to-fluid heat exchanger; and
   a controller configured to prevent condensation on the air-to-fluid heat exchanger by controlling the amount of heat transferred to the second fluid path so that a temperature of the two-phase working fluid within the air-to-fluid heat exchanger is above a dew point temperature of the air passing through the air-to-fluid heat exchanger.

2. The cooling system of claim 1, further comprising a flow regulator positioned between the pump and the air-to-fluid heat exchanger in fluid communication with the first fluid path.

3. The cooling system of claim 1, further comprising a working fluid receiver in fluid communication between the fluid-to-fluid heat exchanger and the pump.

4. The cooling system of claim 1, further comprising a working fluid flow regulating valve in fluid communication between the pump and the air-to-fluid heat exchanger and a working fluid receiver in fluid communication between the fluid-to-fluid heat exchanger and the pump.

5. A cooling system for transferring heat from a heat load to an environment, the cooling system comprising:
   a first cooling cycle containing a two-phase working fluid; and
   a second cooling cycle thermally connected to the first cooling cycle;
   wherein the first cooling cycle comprises:
      a pump configured to increase the pressure of the working fluid without substantially increasing the enthalpy of the working fluid;
      an air-to-fluid heat exchanger in fluid communication with the pump and in thermal communication with the heat load;
      a second heat exchanger having a first fluid path for the working fluid in fluid communication with the air-to-fluid heat exchanger and the pump, and a second fluid path comprising a portion of the second cooling cycle;
   wherein the first and second fluid paths are in thermal communication with one another;
   wherein the first cooling cycle is configured so that air heated by the heat load and flowing through the air-to-fluid heat exchanger causes the two-phase working fluid to at least partially change phase from a liquid to a gas within the air-to-fluid heat exchanger; and
   wherein the second cooling cycle comprises a chilled water system in thermal communication with the environment and wherein the second cooling cycle is configured to maintain a temperature of the two-phase working fluid entering the air-to-fluid heat exchanger above a dew point of the air flowing through the air-to-fluid heat exchanger.

6. The cooling system of claim 5, further comprising a working fluid receiver in the first cooling cycle between the second heat exchanger and the pump.

7. The cooling system of claim 5, further comprising a working fluid flow regulating valve in fluid communication between the pump and the air-to-fluid heat exchanger and a working fluid receiver in fluid communication between the second heat exchanger and the pump.

8. A cooling system for transferring heat from a heat load to an environment, the cooling system comprising:
   a working fluid pump configured to increase the pressure of a two-phase working fluid without substantially increasing the enthalpy of the working fluid;
   an air-to-fluid heat exchanger connected to the pump and having a fluid path in thermal communication with the heat load;
   a second heat exchanger having first and second fluid paths in thermal communication with one another, wherein the first fluid path is configured to provide fluid communication from the air-to-fluid heat exchanger to the pump, and wherein the second fluid path is adapted to thermally connect the air-to-fluid heat exchanger in the first fluid path to a chilled water cooling system that is in thermal communication with the environment;
   wherein the air-to-fluid heat exchanger is configured so that air flowing along the fluid path heats the working fluid and causes the working fluid to at least partially change phase from a liquid to a gas within the air-to-fluid heat exchanger; and
   a controller configured to maintain a temperature of the working fluid at a location fluidly between the second heat exchanger and the air-to-fluid heat exchanger above a dew point temperature of air passing through the air-to-fluid heat exchanger so that the cooling system removes only sensible heat from the air passing there through to prevent condensation on the air-to-fluid heat exchanger.

9. The cooling system of claim 8, further comprising a working fluid receiver in fluid communication between the second heat exchanger and the pump.

10. The cooling system of claim 8, further comprising a working fluid flow regulating valve in fluid communication between the pump and the air-to-fluid heat exchanger and a working fluid receiver in fluid communication between the second heat exchanger and the pump.

11. A heat transfer system, comprising:
   a first heat transfer subsystem adapted to circulate there through a first working fluid selected from the group consisting of chlorofluorocarbons, hydrofluorocarbons and hydrochlorofluorocarbons, and comprising
      an air-to-fluid heat exchanger disposed in a fluid path configured to be in thermal communication with a heat load;
      a pump configured to increase the pressure of the first working fluid without substantially increasing the enthalpy of the first working fluid; and
      at least a portion of a second heat exchanger;
   a second heat transfer subsystem comprising
      at least a second portion of the second heat exchanger; and
      a third heat exchanger;
      wherein the second heat transfer subsystem is adapted to circulate a second working fluid there through, wherein the second working fluid is selected from the group consisting of water, water-ethylene glycol and water-propylene glycol; and
   wherein the first heat transfer subsystem is adapted to cause at least a portion of the first working fluid to undergo a phase change from a liquid to a gas in the air-to-fluid heat exchanger; and
   a system controller configured to prevent condensation on the air-to-fluid heat exchanger by maintaining a temperature of the first working fluid leaving the second heat exchanger above a dew point temperature of air that passes through the air-to-fluid heat exchanger.

12. The system of claim 11, wherein the heat load is a room.

13. The system of claim 11, wherein the heat load is an electronics cabinet.

14. The system of claim 11, further comprising a flow regulator associated with the plurality of the air-to-fluid heat exchanger and which is adapted to control an amount of first working fluid flowing through the air-to-fluid heat exchanger.

15. The system of claim 14, wherein the flow regulator is adapted to control the amount of first working fluid flowing through the air-to-fluid heat exchanger independently of fluid pressure.

16. The system of claim 14, wherein the flow regulator is adapted to maintain a substantially constant flow of first working fluid through the air-to-fluid heat exchanger.

17. The system of claim 14, further comprising a receiver in fluid communication with the first heat transfer subsystem and adapted to accumulate a portion of the first working fluid.

18. The system of claim 17, wherein the receiver is adapted to accumulate a portion of the first working fluid based upon temperature and/or heat load.

19. The system of claim 14, wherein the first heat transfer subsystem comprises a plurality of air-to-fluid heat exchangers, and further comprising a flow regulator associated with each of the plurality of air-to-fluid heat exchangers, wherein each flow regulator is adapted to limit an amount of first working fluid flowing through an associated one of the plurality of air-to-fluid heat exchangers.

20. The system of claim 11, wherein the second heat exchanger is selected from the group consisting of: a tube-in-tube heat exchanger, a shell and tube heat exchanger and a plate and frame heat exchanger.

21. The cooling system of claim 11, further comprising a working fluid receiver in the first heat transfer subsystem between the second heat exchanger and the pump.

22. The cooling system of claim 11, further comprising a working fluid flow regulating valve in fluid communication between the pump and the air-to-fluid heat exchanger and a working fluid receiver in fluid communication between the second heat exchanger and the pump.

23. A cooling system for removing heat from a high density heat load, comprising:
   a first heat transfer system comprising
      a two-phase working fluid;
      a plurality of air-to-fluid heat exchangers configured to transfer heat from the heat load to the working fluid so that at least a portion of the working fluid changes phase from a liquid to a gas within at least one of the air-to-fluid heat exchangers;
      a working fluid flow regulator fluidly coupled with at least one of the plurality of air-to-fluid heat exchangers and configured to limit the maximum working fluid flow to the at least one air-to-fluid heat exchanger;
      a working fluid receiver configured to hold working fluid based on at least one of working fluid temperature, cooling system load and a combination thereof;
      a pump configured to increase the pressure of the working fluid without substantially increasing the enthalpy of the working fluid; and
      a first portion of a fluid-to-fluid heat exchanger;
      wherein the pump is in fluid communication with the working fluid receiver, the first portion of the fluid-to-fluid heat exchanger, and the plurality of air-to-fluid heat exchangers;
   a second heat transfer system comprising
      a second portion of the fluid-to-fluid heat exchanger;
      a single-phase working fluid; and
      a second pump;
      wherein the second pump is in fluid communication with the second portion of the fluid-to-fluid heat exchanger;
   wherein the first heat transfer system is thermally coupled to the second heat transfer system by the fluid-to-fluid heat exchanger; and
   a cooling system controller configured to monitor a dew point temperature of air flowing through the air-to-fluid heat exchanger, maintain a temperature of the two phase working fluid entering one or more of the plurality of air-to-fluid heat exchangers above the dew point temperature, and prevent condensation on the plurality of air-to-fluid heat exchangers.

24. The system of claim 23, wherein the air-to-fluid heat exchangers are located at least partially within an enclosure and the high density heat load is created by electronics within the enclosure, the enclosure having a forced air flow path across the electronics and through one or more of the air-to-fluid heat exchangers.

25. The system of claim 24, wherein first heat transfer system is configured so that the two-phase working fluid is cooled in the fluid-to-fluid heat exchanger upstream from the receiver and pump, then flows from the pump through the regulating valves and then into each air-to-fluid heat exchanger where at least a portion of the working fluid is heated to a boil, and then returns to the fluid-to-fluid heat exchanger where it is once again cooled.

26. The system of claim 23, wherein the single-phase working fluid is selected from the group consisting of: water, water-ethylene glycol, and water-propylene glycol.

27. The system of claim 23, further comprising a working fluid flow regulator associated with each air-to-fluid heat exchanger and configured to limit a maximum working fluid flow to its associated air-to-fluid heat exchanger.

* * * * *